United States Patent [19]

Ushiku et al.

[11] Patent Number: 5,032,890
[45] Date of Patent: Jul. 16, 1991

[54] SEMICONDUCTOR INTEGRATED CIRCUIT WITH DUMMY PATTERNS

[75] Inventors: Yukihiro Ushiku; Takashi Mitsuhashi, both of Yokohama, Japan

[73] Assignee: Kabushiki Kaisha Toshiba, Kawasaki, Japan

[21] Appl. No.: 302,960

[22] Filed: Jan. 30, 1989

[30] Foreign Application Priority Data

Jan. 30, 1988 [JP] Japan .................................. 63-20306
Mar. 22, 1988 [JP] Japan .................................. 63-65676

[51] Int. Cl.$^5$ ............................................ H01L 27/02
[52] U.S. Cl. ..................................... 357/41; 357/68; 357/40; 357/45; 357/71; 357/59
[58] Field of Search .................. 357/41, 68, 51, 40, 357/71, 65, 59 J, 45, 71 P

[56] References Cited

U.S. PATENT DOCUMENTS

4,587,549  5/1986  Ushiku ................................. 357/71
4,949,162  8/1990  Tamaki et al. ....................... 357/71

FOREIGN PATENT DOCUMENTS

0026233  4/1981  European Pat. Off. .
0061939  10/1982  European Pat. Off. .
0206444  12/1986  European Pat. Off. .
0096455  7/1988  European Pat. Off. .
3640363  8/1987  Fed. Rep. of Germany .
61-276345  12/1986  Japan .
63-92042  4/1988  Japan .

OTHER PUBLICATIONS

Smith et al., "A 'Missing Neighbor Model' for Capacitive Loading in VLSI Interconnect Channels", *IEEE Journal of Solid-State Circuits*, vol. SC-22, No. 24, Aug. 1987, pp. 553-557.
Shingh et al., "Deposition of Planarized Dielectric Layers by Biased Sputter Deposition", J. Vac. Sci. Technol., B5(2), Mar./Apr. 1987, pp. 567-574.
Mitsuhashi et al., "Thermally Stable and Completely Planarized Multilevel Interconnection with Selective CVD-W via and $^{31}P+/^{11}B+$ Implanted WSix/TiN/Si Contact", 1988 Symposium on VLSI Technology, Digest of Technical Papers, IEEE, May 1988, pp. 71-72.

*Primary Examiner*—William Mintel
*Attorney, Agent, or Firm*—Oblon, Spivak, McClelland, Maier & Neustadt

[57] ABSTRACT

A semiconductor integrated circuit device including a semiconductor substrate, a lower interconnection layer pattern formed along first parallel lines on the substrate, an insulating layer formed on the pattern, and an upper interconnection layer pattern formed along second parallel lines perpendicularly intersecting with the first parallel lines on the insulating layer. A dummy pattern made of the same material as that of the lower interconnection layer pattern, and not electrically connected to the upper and lower interconnection layer patterns, is formed in a region which is arranged below the upper interconnection layer pattern and in which the first parallel lines intersect the second parallel lines. The dummy pattern has the same level as that of the lower interconnection layer pattern, has no lower interconnection layer pattern, and is adjacent to the lower interconnection layer pattern, at a predetermined interval from the lower interconnection layer pattern. By arranging such a dummy pattern, the insulating layer formed on the lower interconnection layer is flattened, thereby preventing disconnection of the upper interconnection layer.

5 Claims, 9 Drawing Sheets

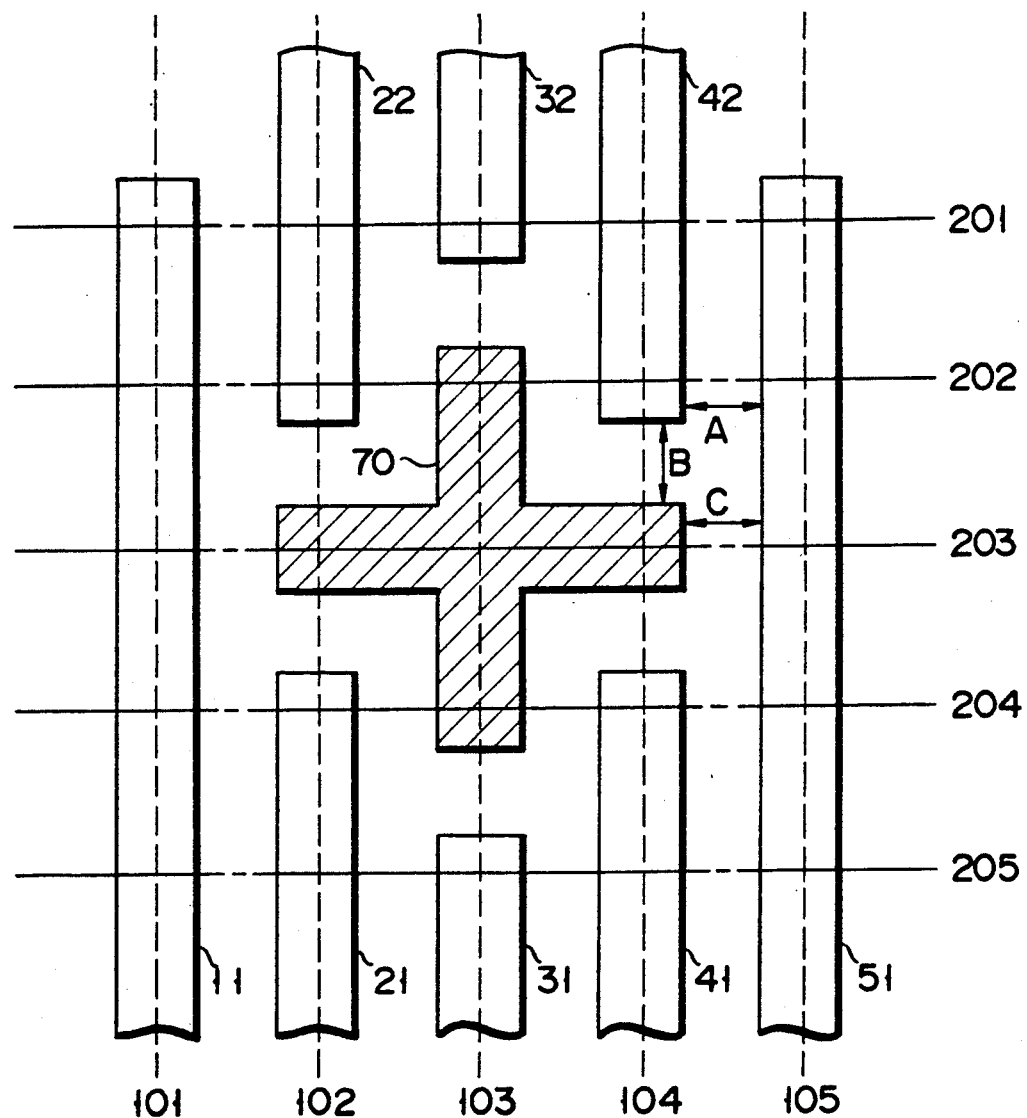
F I G. 6

SEMICONDUCTOR INTEGRATED CIRCUIT WITH DUMMY PATTERNS

BACKGROUND OF THE INVENTION

1. Field of the Invention

The present invention relates to a semiconductor integrated circuit device having multi-level interconnection layers and, more particularly, to a semiconductor integrated circuit device having a multi-level interconnection structure in which upper and lower interconnection layers intersect with each other.

2. Description of the Prior Art

In conventional semiconductor integrated circuit device, a multi-level interconnection structure having multi-level interconnection layers is employed to improve an integration degree. FIG. 1 shows a conventional grid-type interconnection layout in which a lower interconnection layer is formed on wafer 10 along prospective interconnection lines. Referring to FIG. 1, broken lines 101 to 105 represent grid lines along which the lower interconnection layer can be formed, and dash lines 201 to 205 represent grid lines along which the upper interconnection layer can be formed. In FIG. 1, only the lower interconnection layer is shown, and the upper interconnection layer is omitted.

The lower interconnection layer is constituted by pattern 11 formed along grid line 101, patterns 21 and 22 formed along grid line 102, patterns 31 and 32 formed along grid line 103, patterns 41 and 42 formed along grid line 104, and pattern 51 formed along grid line 105. On grid lines 102, 103, and 104, patterns are partially disconnected.

The multi-level interconnection with the above arrangement has the following three problems.

The first problem is a configuration of the surface of an insulating film formed on the lower interconnection layer. A section of a structure along line 201 in FIG. 1 is shown in FIG. 2A. In general, when an insulating material is deposited on the surface of the wafer having steps, the insulating film having a substantially equal thickness is formed on upper, side, and bottom surfaces of the steps. Therefore, as shown in FIG. 2A, when patterns 11, 21, 31, 41, and 51 are formed on wafer 10 at a constant pitch, an insulating film having a thickness which is ½ or more of an interval between the patterns is formed, so that grooves at the intervals of the patterns are buried with the insulating film. As a result, the surface of the insulating film can be substantially flattened.

When the pattern is partially discontinued, as in pattern 31, patterns do not exist at equal intervals in, e.g., a structure along line 204, as shown in FIG. 2B, but the interval between patterns 21 and 41 is larger than intervals between other adjacent patterns. In this large groove, a step is undesirably formed on the surface of the insulating film formed in the groove. Since this step is substantially vertical, when an upper interconnection layer is formed on this insulating film 60, disconnection may occur in the upper interconnection layer. Therefore, a manufacturing step for flattening insulating film 60 is required. In this case, the ratios of the depth and the width of the grooves, i.e., aspect ratios are different in large and small regions wherein the pattern of the lower interconnection layer does not exist. Therefore, a sufficient flattening step is required in consideration of the worst case as the basis, thereby increasing a manufacturing cost.

The second problem is a loading effect during etching for forming a first interconnection layer. In normal anisotropic etching, a polymer film consisting of carbon, oxygen, fluorine, and the like is attached to a side wall of an etched portion to serve as an etching protection film, and side etching is prevented, thereby obtaining a substantially vertical shape. In this case, since the carbon is supplied from a resist, side etching can be prevented near a dense resist pattern. However, in a sparce resist pattern, side etching is advanced because carbon is not sufficiently supplied. In particular, in a portion near the peripheral portion of a chip and having a low interconnection density, the interval between adjacent interconnection patterns is large and the interconnection patterns tend to be isolated. In the worst case, disconnection of the interconnection layer may occur.

The third problem is that a capacitance of an interconnection pattern is varied depending upon the presence/absence of adjacent interconnection patterns. In recent semiconductor elements, an operation speed largely varies depending upon the value of the interconnection capacitance. These interconnection capacitances are roughly classified into a capacitance with respect to ground and a capacitance between adjacent interconnection patterns. As an interval between adjacent interconnection patterns is decreased with the miniaturization of elements, a ratio of the capacitance between adjacent interconnection patterns is increased.

An interconnection capacitance and hence the operation speed of the element largely change depending on whether an adjacent interconnection pattern exists. Design for a semiconductor integrated circuit device must be performed in consideration of the above difference. When a large scale integrated circuit which cannot be designed without employing an automatic placement and routing programs by a computer is designed, the above consideration is impractical. Note that, in an integrated circuit having uniform capacitances, the operation speed can be easily estimated and the circuit can be operated at optimal timings as compared to an integrated circuit in which a circuit having a large interconnection capacitance due to adjacent interconnection patterns and a circuit having a small interconnection capacitance without adjacent interconnection patterns are mixed.

Although a layout method in which an interconnection layer is formed on grid-type interconnection lines is exemplified and described as described above, a general layout method without employing the grid-type interconnection line also has the same problems. More specifically, when a general layout method as shown in FIG. 3 is employed, in a portion in which lower interconnection layer patterns 11a and 11b are arranged at a small interval, i.e., a portion along alternate long and short dash line 201a, insulating film 60 has a flat surface, as shown in FIG. 4A. However, in a portion including a part having a small width, e.g., lower interconnection layer pattern 11a, and therefore having a large interval between the part having a small width of pattern 11a and lower interconnection layer pattern 11b, i.e., a portion along alternate long and short dash line 201b, the surface of insulating film 60 is uneven, as shown in FIG. 4B. For this reason, it is difficult to form upper interconnection layer patterns 21a and 21b.

SUMMARY OF THE INVENTION

It is an object of the present invention to provide semiconductor integrated circuit device having a flat insulating layer formed on a lower interconnection layer and capable of preventing disconnection of an upper interconnection layer.

It is another object of the present invention to provide a method of manufacturing a semiconductor integrated circuit device which can form an insulating layer having a flat surface on a lower interconnection layer, and can prevent disconnection of an upper interconnection layer.

According to the present invention, there is provided a semiconductor integrated circuit device comprising a semiconductor substrate, a lower interconnection layer pattern formed on the substrate, an insulating layer formed on the pattern, and an upper interconnection layer pattern formed on the layer, wherein a dummy pattern made of the same material as that of the lower interconnection layer pattern, and not electrically connected to the upper and lower interconnection layer patterns, is formed in a region arranged below the upper interconnection layer pattern, having the same level as that of the lower interconnection layer pattern, having no lower interconnection layer pattern, and adjacent to the lower interconnection layer pattern, at a predetermined interval from the lower interconnection layer pattern.

The lower interconnection layer pattern can be formed along first parallel lines, and the upper interconnection layer pattern can be formed along second parallel lines perpendicularly intersecting with the first parallel lines. In this case, the dummy pattern can be formed in a region wherein the first parallel lines intersect with the second parallel lines.

The dummy pattern can be formed in a region obtained by uniformly reducing, by at least a separation interval between adjacent lower interconnection layer patterns, a remaining region obtained by subtracting a lower interconnection layer pattern region from a region for an upper interconnection layer pattern.

According to the present invention, there is further provided a method of manufacturing a semiconductor integrated circuit device, comprising the steps of forming a lower interconnection layer pattern and a dummy pattern which are not electrically connected to each other on a semiconductor substrate, forming an insulating layer on the patterns, and forming an upper interconnection layer pattern not electrically connected to the dummy pattern on the insulating layer, wherein the dummy pattern is formed in a region arranged below the upper interconnection layer pattern, having the same level as that of the lower interconnection layer pattern, having no lower interconnection layer pattern, and adjacent to the lower interconnection layer pattern, at a predetermined interval from the lower interconnection layer pattern.

The dummy pattern can be formed in a region obtained by reducing a remaining region obtained by subtracting a lower interconnection layer pattern region from a region for the upper interconnection layer pattern, so that sides of the remaining region opposing the lower interconnection layer patterns are backed into the remaining region by a separation interval between adjacent lower interconnection layer patterns, and that sides not opposing the lower interconnection layer patterns are backed into the remaining region by half or less the separation interval between adjacent lower interconnection layer patterns.

According to the present invention, by arranging a dummy pattern in a region wherein no lower interconnection layer pattern exists, lower interconnection layer patterns can be distributed at a substantially uniform density. Thus, spaces between the lower interconnection layers along regions on which the upper interconnection pattern is formed can be substantially equal to each other, thereby easily flattening an interlayer insulating film.

Since interconnection patterns are not isolated, abnormal etching of interconnection patterns does not occur. In addition, since every interconnection pattern has adjacent interconnection patterns, the capacitances of all the interconnection patterns can be uniformly dealt with as a function corresponding to the length of the interconnection pattern so that a circuit design is simplified and an accurate operation timing can be obtained.

BRIEF DESCRIPTION OF THE DRAWINGS

FIG. 6 is a plan view showing interconnection patterns of the semiconductor integrated circuit according to Example 2 of the present invention;

DETAILED DESCRIPTION OF THE PREFERRED EMBODIMENTS

Figure 1:
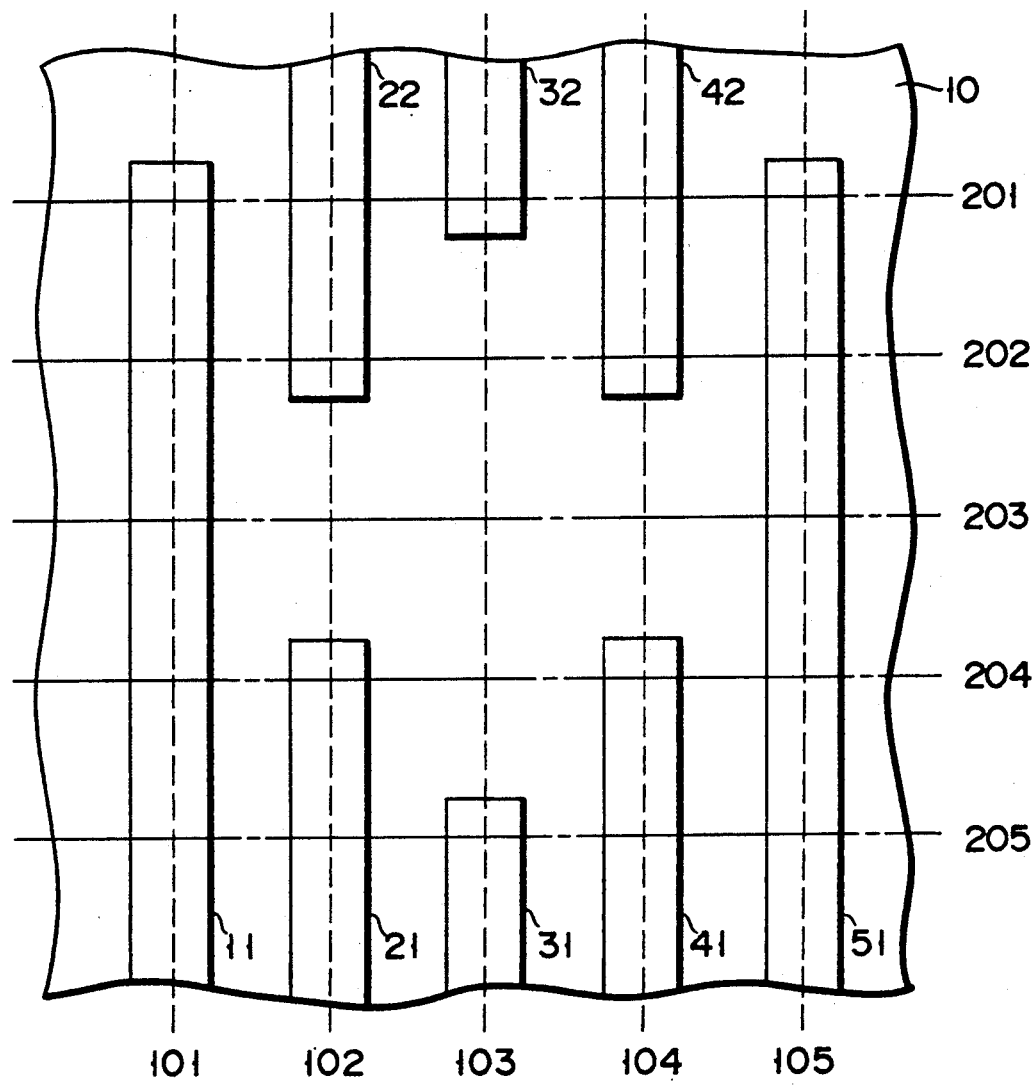
FIG. 1 is a plan view showing an arrangement of interconnection patterns of a conventional semiconductor integrated circuit.

The fundamental principle of the present invention is as follows.

The above-mentioned three problems are caused since patterns in a lower interconnection layer do not exist on a semiconductor chip at uniform intervals. In particular, the conventional biggest problem of difficulty in flattening of the surface of an interlayer insulating film is caused by nonuniformity of the aspect ratio of grooves formed between adjacent patterns in the lower interconnection layer. When an upper interconnection layer is formed on an interlayer insulating film having steps, disconnection in the upper interconnection layer above the step undesirably occurs.

The present inventors have studied in consideration of the above problems. As a result, it is found that the above problems can be solved by arranging a dummy pattern not electrically connected to any interconnection layers on a portion wherein no lower interconnection layer pattern exits. More specifically, by arranging the dummy pattern, the aspect ratio of the grooves formed between the adjacent patterns in the lower interconnection layer becomes uniform, thereby flattening the surface of the interlayer insulating film.

Since the above arrangement may be made only on lines (grids) on which upper interconnection layer patterns are formed, more particularly, an interconnection patter or a dummy pattern may be arranged on all the intersection points between lines (grids) of the upper and lower interconnection layer patterns. In addition, when grids are not formed by a grid-type layout method but a normal layout method, a dummy pattern obtained by reducing a region obtained by subtracting a partial region which is common to the upper and lower interconnection layer patterns from a region for the upper interconnection layer pattern, so s to keep a predetermined interval from the lower interconnection layer pattern, may be formed with the lower interconnection layer.

By arranging the dummy pattern as described above the dummy pattern exits on a portion wherein the lower interconnection patterns are not closely formed. Therefore, the density of the lower interconnection layer patterns is rendered uniform, thus preventing abnormal etching for forming the interconnection layer patterns. In addition, since an interconnection pattern or a dummy pattern always exists adjacent to an interconnection pattern, a capacitance between adjacent interconnection patterns is proportional to the length of the interconnection pattern, thus realizing an easy estimation of the circuit operation.

According to the present invention, dummy patterns are arranged on each intersection point between upper and lower interconnection layer grids before the lower and upper level interconnection patterns are formed. Then, the dummy patterns overlap actual interconnection patterns, so that desired interconnection and dummy patterns can be obtained.

After the upper and lower level interconnection layers are formed, the dummy pattern can be automatically produced using layout data of the upper and lower interconnection layers in the computer in accordance with the program for performing a geometrical graphic operation associated with an interlayer layout pattern and a size correction of the pattern. Therefore, after the interconnection layer is actually formed, a vacant space need not be found to form an interconnection pattern not connected to any portions in the vacant space, thereby not increasing the designing steps.

In the another embodiment of the present invention, other dummy patterns may be formed between uppermost interconnection patterns. By doing so, the uppermost interconnection patterns can be distributed at a substantially uniform density.

Various examples of the present invention will be described hereinafter with reference to the accompanying drawings.

EXAMPLE 1

Figure 5:
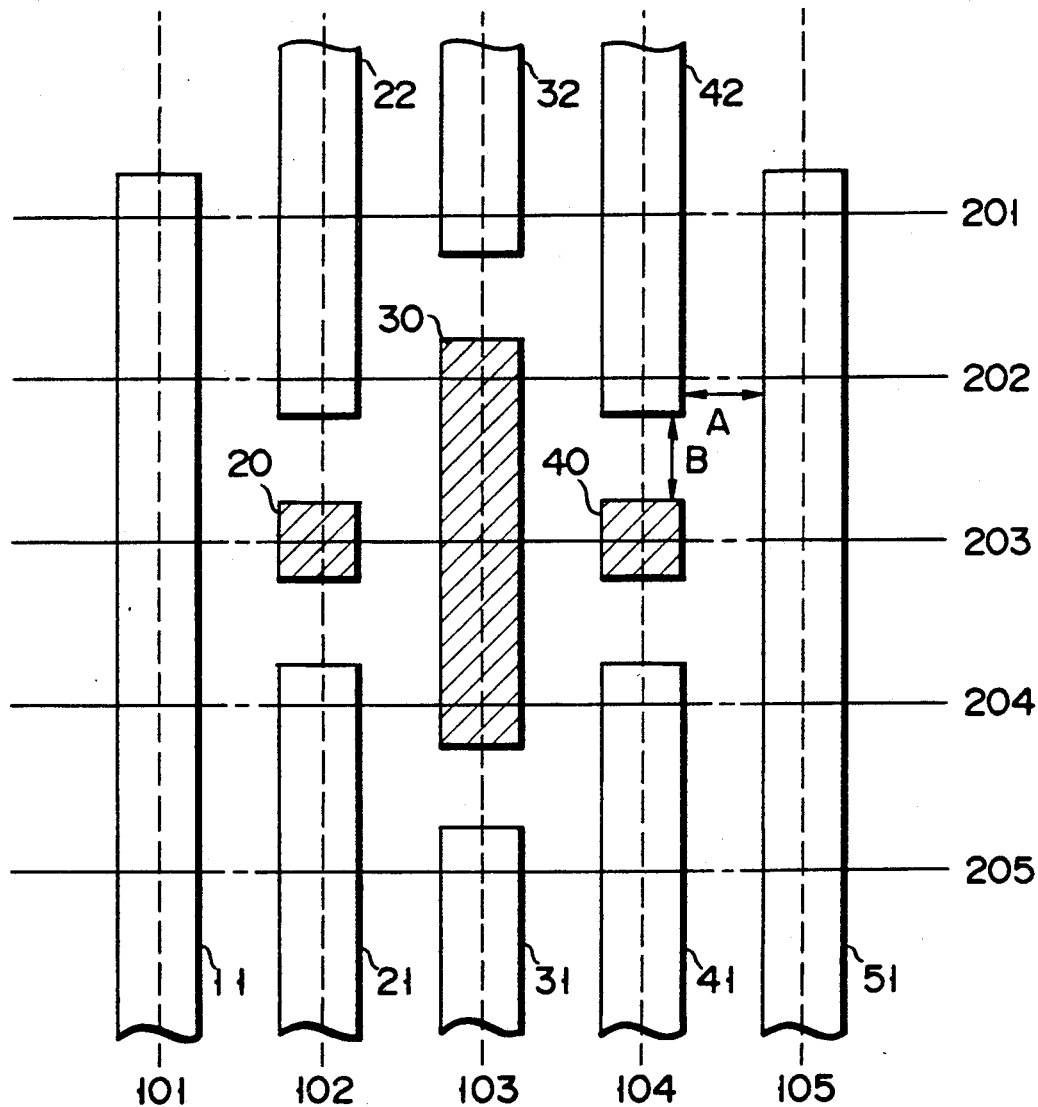
FIG. 5 is a plan view showing interconnection patterns of a semiconductor integrated circuit according to Example 1 of the present invention.

In an interconnection layout of a semiconductor integrated circuit device shown in FIG. 5, broken lines 101, ..., and 105 represent grids along which lower interconnection layer patterns pass. Reference numerals 11, ..., and 51 denote a detailed layout arrangement of lower interconnection layer patterns. Dash lines 201, and 205 represent grids along which upper interconnection layer patterns pass, and the upper interconnection layer patterns are omitted for sake of simplicity. Lower and upper interconnection layer pattern grids orthogonally intersect with each other.

The above arrangement shown in FIG. 5 is the same as in FIG. 1. This embodiment differs from the conventional technique in that a dummy pattern not associated with connection of signals is arranged on a grid on which no interconnection pattern exists. More specifically, dummy pattern 20 is formed in a vacant region wherein interconnection patterns are disconnected on grid 102, dummy pattern 30 is formed in a vacant region on grid 103, and dummy pattern 40 is formed in a vacant region on grid 104. The line widths of dummy patterns 20, 30, and 40 are equal to those of the interconnection patterns. Interval B between the interconnection and dummy patterns on the same grid is substantially equal to interconnection pattern interval A.

Dummy patterns 20, 30, and 40 are made of the same material as that of interconnection patterns 11, ..., and 51, and are simultaneously formed when the interconnection patterns are formed. More specifically, when the interconnection patterns are formed, the mask for the dummy pattern is simultaneously formed on a conductive film together with a resist mask for the interconnection pattern. The conductive film is patterned by selective etching using the resist mask, so that the interconnection and dummy patterns are simultaneously formed.

Figure 2A:
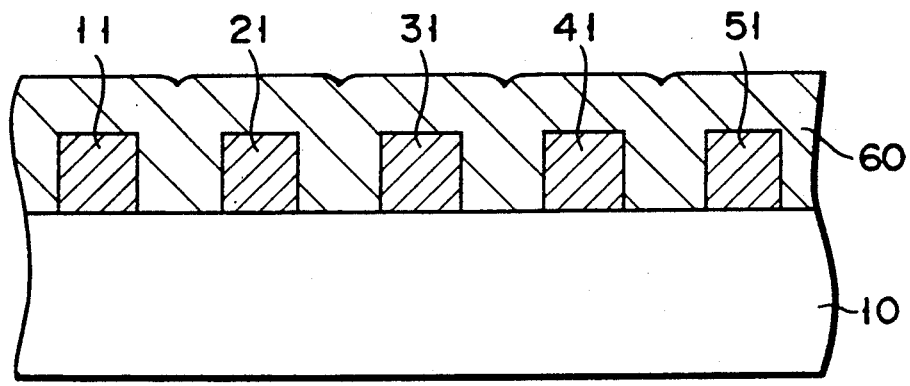
FIG. 2A is a sectional view along line 201 in FIG. 1.
Figure 2B:
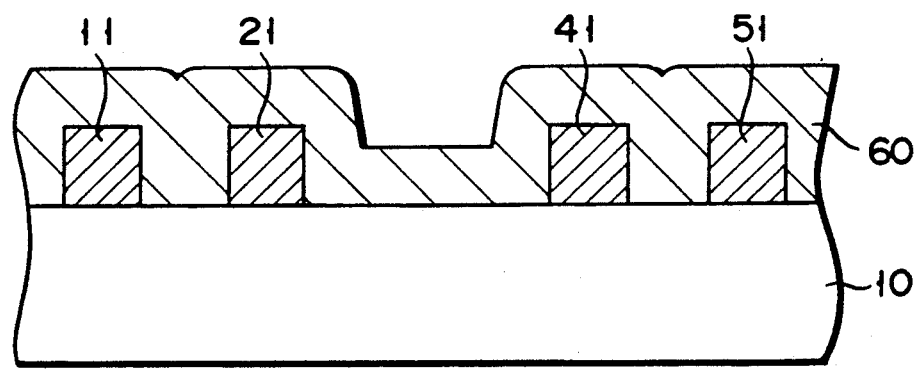
FIG. 2B is a sectional view along line 204 in FIG. 1.

With the above arrangement, an interconnection pattern or a dummy pattern always exists on each intersection point between lower and upper interconnection layer grids. Therefore, intervals between the lower interconnection layer patterns are constant along all grids 201, ..., and 205 along which the upper interconnection layer patterns pass. More specifically, not only the shape of the sections of the portions along grids 201 and 205, but also the shape of the sections of the portions along grids 202, 203, and 204 becomes as shown in FIG. 2A. Therefore, an interlayer insulating film formed on the lower interconnection layer can be easily flattened, thus realizing a decrease in manufacturing cost. Furthermore, since the interlayer insulating film can be flattened, disconnection of the upper interconnection layer pattern can be previously prevented, thus improving reliability. The density of lower interconnection layer patterns is rendered uniform, so that abnormal etching of the interconnection pattern, unbalance of an interconnection capacitance, and the like can be prevented.

EXAMPLE 2

An interconnection layout shown in FIG. 6 differs from that shown in FIG. 5 in that dummy patterns on the adjacent grids are connected to each other to obtain one dummy pattern 70. In this case, interval B between dummy pattern 70 and an interconnection pattern on the lower interconnection layer pattern grid is equal to interconnection interval A in the same manner as in the above-mentioned Example 1. In addition, interval C between dummy pattern 70 and an interconnection pattern on the upper interconnection layer pattern grid is equal to interconnection interval A.

Even if the above arrangement is employed, the same effect as in Example 1 can be obtained. Note that in this example, it is desirable that intervals B and C between the dummy pattern and the interconnection pattern are substantially equal to interconnection interval A. However, even if intervals B and C are substantially twice interconnection interval A, the interlayer insulating film can be easily flattened.

EXAMPLE 3

Figure 7:
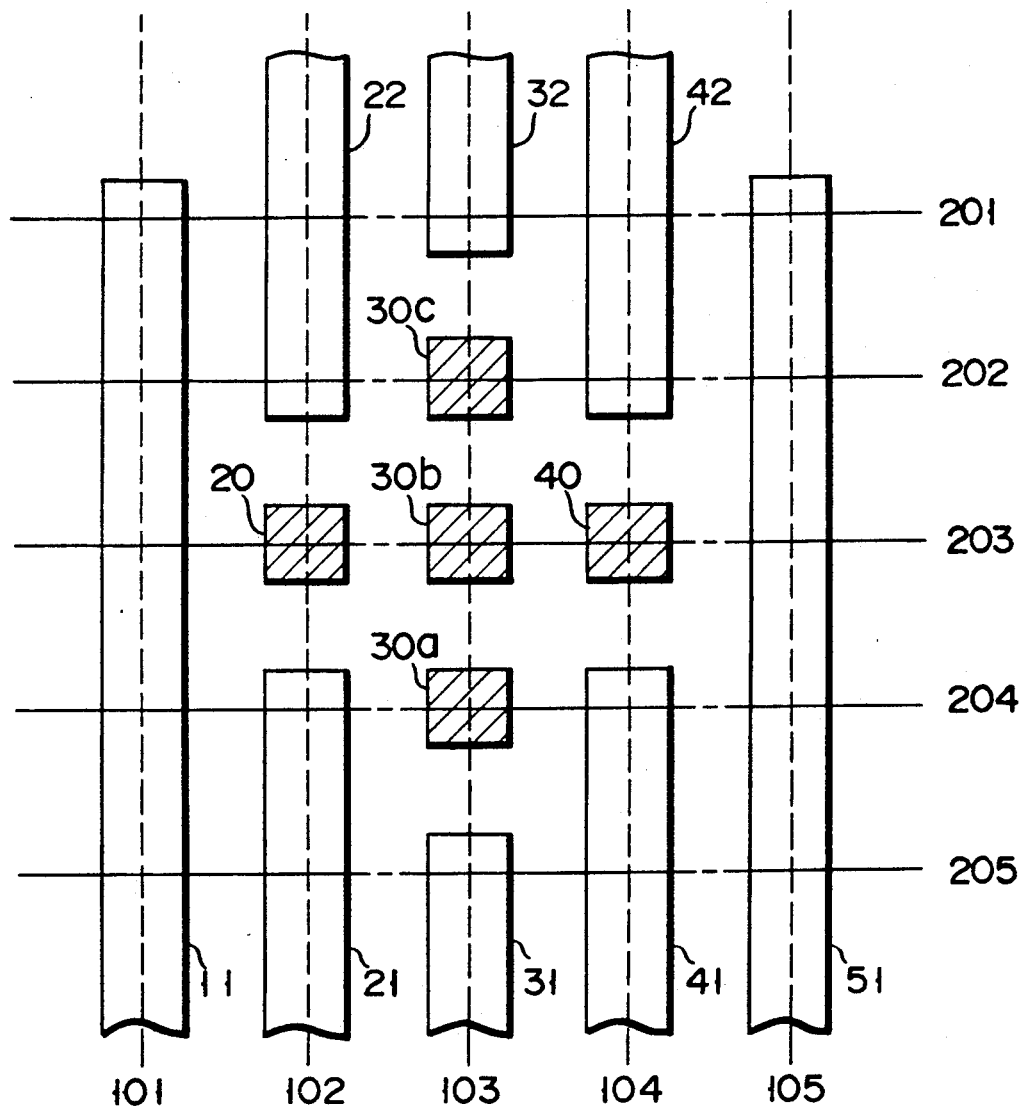
FIG. 7 is a plan view showing interconnection patterns of the semiconductor integrated circuit according to Example 3 of the present invention.

An interconnection layout shown in FIG. 7 differs from that in FIG. 5 in that dummy patterns are arranged on only the intersecting portions between the upper and lower interconnection layer pattern grids. More specifically, dummy pattern 20 is formed in a vacant region on grid 102, dummy patterns 30a, 30b, and 30c are formed in a vacant region on grid 103, and dummy pattern 40 is formed in a vacant region on grid 104.

When a lower interconnection layer is designed, dummy patterns are arranged in the intersecting portions between the lower and upper interconnection layer pattern grids in advance, and interconnection patterns are superposed thereon. Since the grids in the lower and upper interconnection layers are given in advance, dummy patterns can be formed on all the intersecting portions between the grids of both layers so as to be spaced apart from each other. Thereafter, the dummy patterns are superposed on the actual lower interconnection layer to form a desired interconnection pattern. At this time, when the interconnection pattern associated with connection of signals is formed on the dummy pattern, the dummy pattern is completely included in the interconnection pattern, or slightly extends outside the interconnection pattern to serve as a part of the interconnection pattern. As a result, interconnection pattern formation is not interfered and short-circuiting does not occur.

If a dummy pattern is formed in the intersection point between both grids in advance, when an error is made in actual interconnection pattern formation, after the interconnection pattern thus formed is corrected, the corrected pattern may be combined again with another dummy pattern formed in advance. As described above, a dummy pattern is formed on each intersection point between the grids in both the lower and upper interconnection layers in advance, so that a desired lower interconnection layer pattern can be obtained without increasing the number of designing steps. In addition, a dummy pattern can be obtained on the intersection point between both the grids in a non-interconnection region. As a result, an interlayer insulating film formed thereon can be easily flattened, thus preventing disconnection of the upper interconnection layer patterns.

According to this example, therefore, not only the same effect as in Example 1 can be obtained, but also the vacant region of the interconnection pattern need not be found, thus decreasing designing cost for the lower interconnection layer.

EXAMPLE 4

Figure 3:
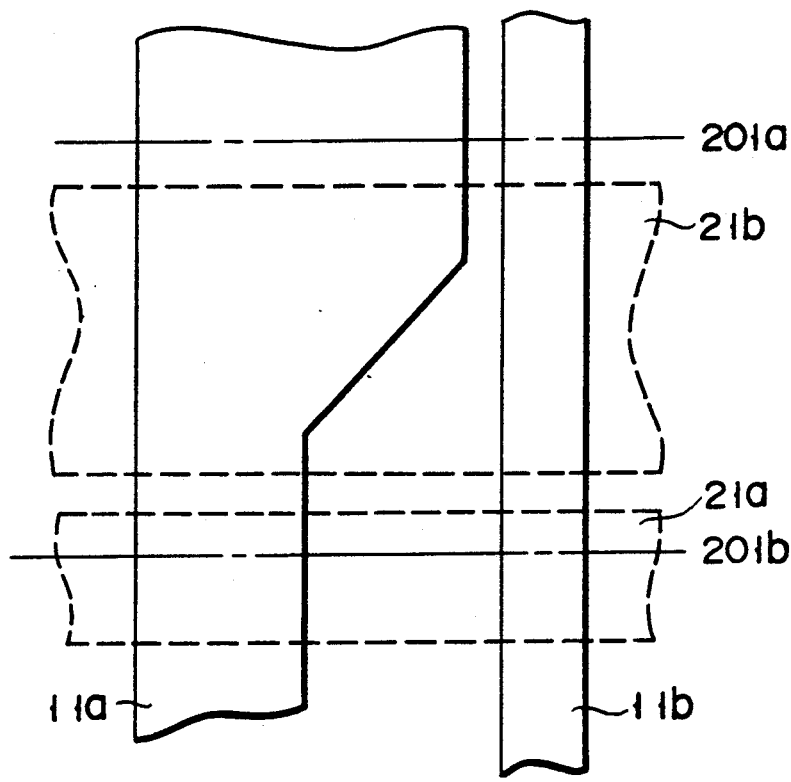
FIG. 3 is a plan view showing an arrangement of interconnection patterns of the conventional semiconductor integrated circuit according to a normal layout method.
Figure 4A:
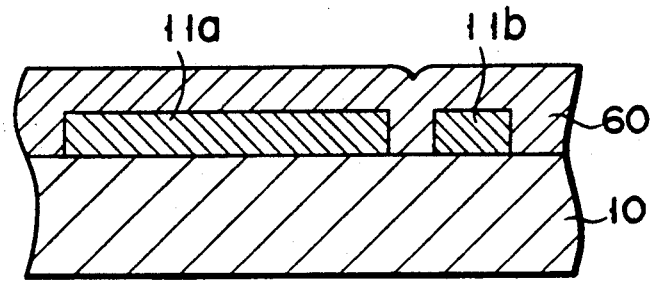
FIG. 4A is a sectional view along line 201a in FIG. 1.
Figure 4B:
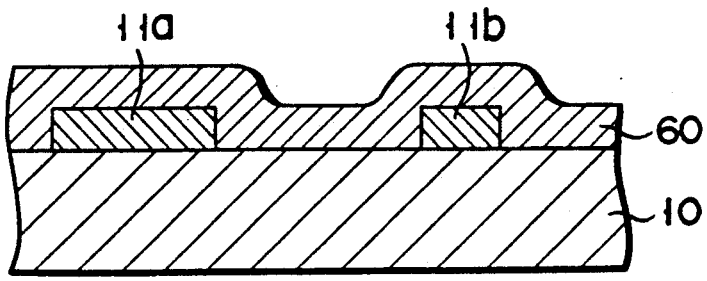
FIG. 4B is a sectional view along line 201b in FIG. 1.
Figure 8:
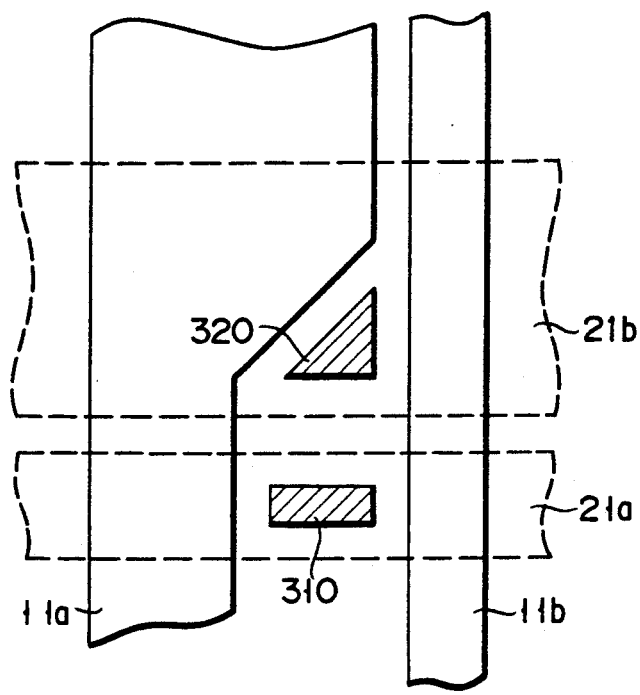
FIG. 8 is a plan view showing interconnection patterns of the semiconductor integrated circuit according to Example 4 of the present invention.

An interconnection layout shown in FIG. 8 differs from the conventional one shown in FIG. 3 in that dummy patterns not associated with signals and interconnection pattern are formed. More specifically, dummy pattern 310 is formed in a large region wherein no lower interconnection layer pattern exists and below upper interconnection layer pattern 21a, and dummy pattern 320 is formed in a large region wherein no lower interconnection layer pattern exists and below upper interconnection layer pattern 21b. Dummy patterns 310, 320, and the like are formed so as to satisfy the predetermined design standard of the lower and upper interconnection layers, and the distances between patterns 11a, 11b, 310, and 320 opposing to each other are substantially equal to a predetermined minimum size.

Figure 9:
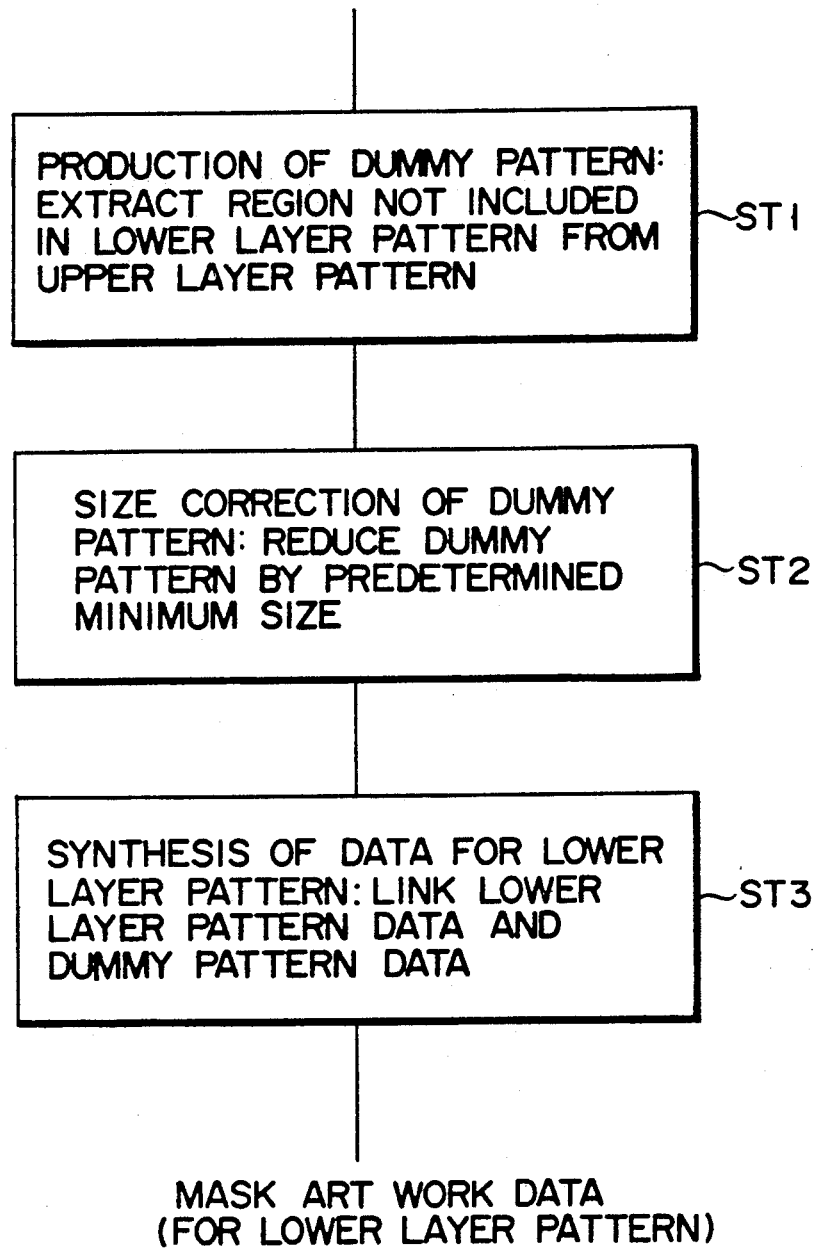
FIG. 9 is a flow chart for explaining procedures of computer processing for obtaining the interconnection patterns shown in FIG. 8.

FIG. 9 is a flow chart for explaining a program processing for producing lower layer pattern data. Upper and lower layer pattern data are digitized and stored in a computer. In this state, the upper and lower layer data can be clearly distinguished. First, in the step for producing a dummy pattern (ST1), a region not included in the lower layer pattern is extracted from the upper layer pattern. These regions are referred to as a dummy pattern. Then, the dummy pattern is reduced in the step for correcting the size of the dummy pattern (ST2). At this time, the dummy pattern is reduced by the minimum size corresponding to the predetermined minimum interval between lower layer patterns so as to satisfy the predetermined design standard. In the next step (ST3), the data of the dummy pattern thus corrected is linked with the data of the lower layer pattern, thus producing the lower layer pattern using this linked data as mask art work data.

EXAMPLE 5

Figure 10:
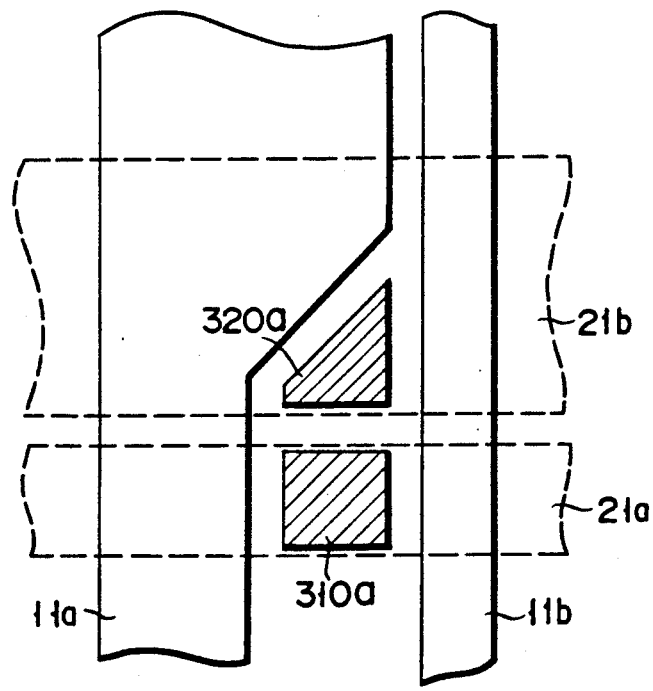
FIG. 10 is a plan view showing interconnection patterns of the semiconductor integrated circuit according to Example 5 of the present invention.

An interconnection layout shown in FIG. 10 differs from that shown in FIG. 8 in that dummy patterns 310a and 320a are expanded in the widthwise direction of upper interconnection layer patterns 21a and 21b. Therefore, the region wherein no dummy pattern and no lower interconnection layer exist can be decreased while the dummy patterns keep the constant intervals with lower interconnection layer patterns 11a and 11b, thus further increasing a flattening effect.

Figure 11:
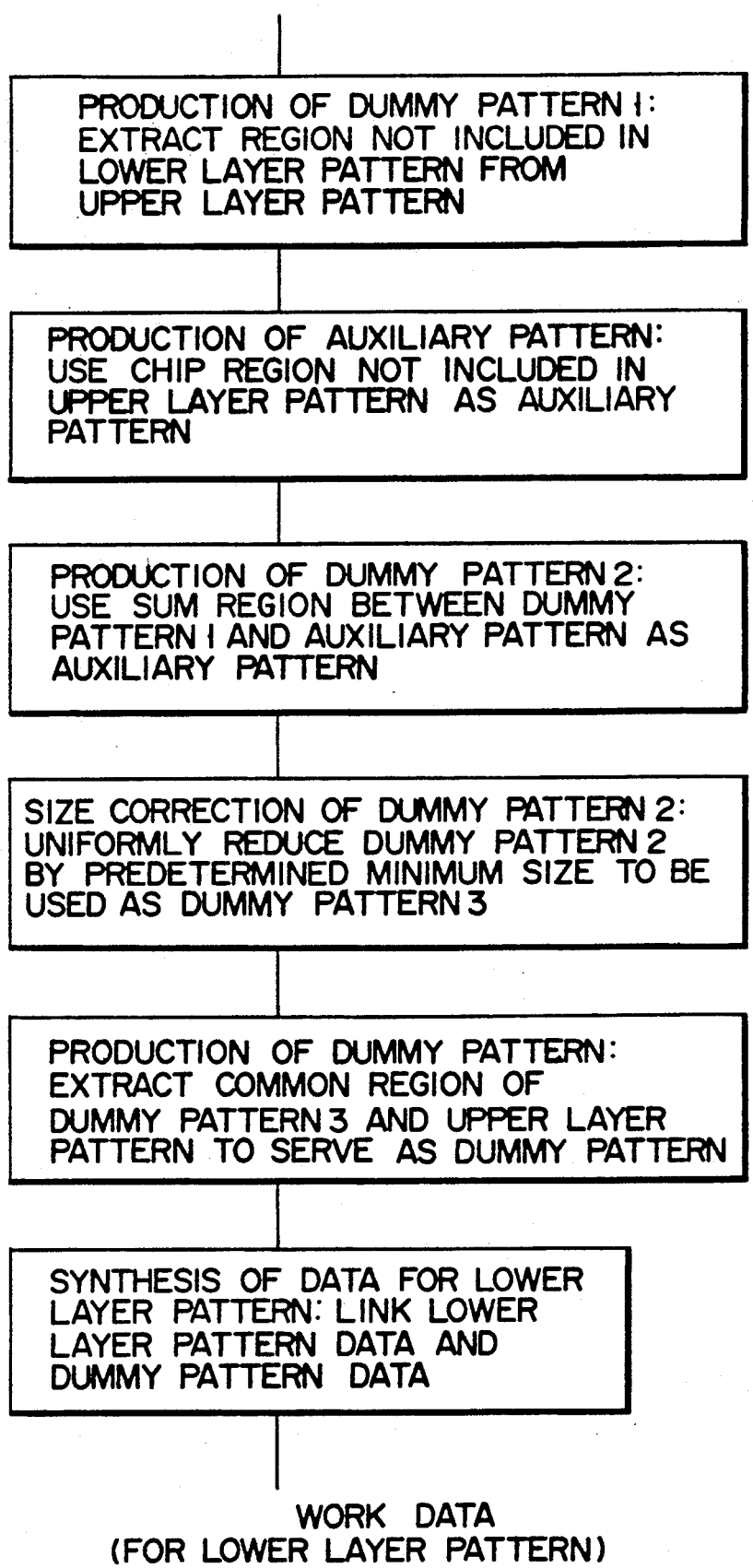
FIG. 11 is a flow chart for explaining procedures of computer processing for obtaining the interconnection patterns shown in FIG. 10.

These dummy patterns 310a and 320a can be formed in accordance with the computer processing procedure shown in FIG. 11.

The present invention is not limited to the abovementioned examples, and various changes and modifications may be made without departing from the spirit and scope of the invention.

As has been described above, according to the present invention, by arranging a dummy pattern in a region wherein no lower interconnection layer pattern exists, an interlayer insulating film can be easily flattened. Therefore, disconnection of upper interconnection layer patterns can be previously prevented without increasing a manufacturing cost for flattening the interlayer insulating film, thereby improving reliability.

What is claimed is:

1. A semiconductor integrated circuit device, comprising:
    a semiconductor substrate,
    a lower interconnection layer pattern formed along first parallel lines on said substrate,
    an insulating layer formed on said lower pattern, and
    an upper interconnection layer pattern formed along second parallel lines on said layer, said second parallel lines perpendicularly intersecting with said first parallel lines, and
    a plurality of discrete dummy patterns made of the same material as that of said lower interconnection layer pattern, and not electrically connected to said upper and lower interconnection layer patterns, formed only at intersections of said first parallel lines and said second parallel lines, said dummy patterns having the same level as that of said lower interconnection layer pattern, and being adjacent to said lower interconnection layer pattern, at a predetermined interval from said lower interconnection layer pattern.

2. A device according to claim 1, wherein said first and second parallel lines are grids.

3. A device according to claim 1, wherein other dummy patterns are formed between uppermost interconnection patterns.

4. A semiconductor integrated circuit device, comprising:
- a semiconductor substrate,
- a lower interconnection layer pattern formed on the substrate,
- an insulating layer formed on said lower pattern, and
- an upper interconnection layer pattern formed on the layer, and
- a dummy pattern made of the same material as that of the lower interconnection layer pattern, and not electrically connected to the upper and lower interconnection layer patterns, formed in regions arranged below the upper interconnection layer pattern and obtained by uniformly reducing, by at least a separation interval between said adjacent lower interconnection layer patterns, remaining regions obtained by subtracting said lower interconnection layer pattern from said upper interconnection layer pattern, said dummy pattern having the same level as that of the lower interconnection layer pattern and being adjacent to the lower interconnection layer pattern, at a predetermined interval from the lower interconnection layer pattern.

5. A device according to claim 4, wherein said dummy pattern is formed in regions obtained by uniformly reducing remaining regions obtained by subtracting said lower interconnection layer pattern from said upper interconnection layer pattern, so that sides of said remaining regions opposing said lower interconnection layer patterns are separated from said lower interconnection patterns by said separation interval between said adjacent lower interconnection layer patterns, and that sides not opposing said lower interconnection layer patterns are separated from adjacent downward extensions of sides of said upper connection layer pattern by no more than half said separation interval between said adjacent lower interconnection layer patterns.

* * * * *